United States Patent [19]

Peng et al.

[11] Patent Number: 5,625,587

[45] Date of Patent: Apr. 29, 1997

[54] RARE EARTH MANGANATE FILMS MADE BY METALORGANIC DECOMPOSITION OR METALORGANIC CHEMICAL VAPOR DEPOSITION FOR NONVOLATILE MEMORY DEVICES

[75] Inventors: Chien-Hsiung Peng; Seshu B. Desu; Jie Si, all of Blacksburg, Va.

[73] Assignee: Virginia Polytechnic Institute and State University, Blacksburg, Va.

[21] Appl. No.: 501,283

[22] Filed: Jul. 12, 1995

[51] Int. Cl.$^6$ .................................................. H01L 29/78
[52] U.S. Cl. ........................ 365/145; 427/124; 427/419.1
[58] Field of Search .................................. 365/145, 149, 365/117; 257/295; 427/124, 419.1

[56] References Cited

U.S. PATENT DOCUMENTS

| | | | |
|---|---|---|---|
| 5,418,389 | 5/1995 | Watanabe | 365/145 |
| 5,442,585 | 8/1995 | Eguchi et al. | 365/149 |
| 5,481,490 | 1/1996 | Watanabe et al. | 365/145 |

*Primary Examiner*—David C. Nelms
*Assistant Examiner*—Vu A. Le
*Attorney, Agent, or Firm*—Davis, Graham & Stubbs

[57] ABSTRACT

A ferroelectric memory device having a perovskite thin film of a rare earth manganate and processes for manufacturing the same. The perovskite thin film layer has properties consistent with high quality nonvolatile memory devices. The perovskite thin film layer can be applied by a MOCVD process, by a MOD process, or a liquid source delivery process, all of which are described.

2 Claims, 4 Drawing Sheets

RARE EARTH MANGANATE FILMS MADE BY METALORGANIC DECOMPOSITION OR METALORGANIC CHEMICAL VAPOR DEPOSITION FOR NONVOLATILE MEMORY DEVICES

FIELD OF THE INVENTION

The present invention relates to the field of nonvolatile memory devices using rare earth manganate films, and processes for applying the films using metalorganic decomposition and metalorganic chemical vapor deposition or liquid source delivery method.

BACKGROUND OF THE INVENTION

Semiconductor devices such as a dynamic and nonvolatile random access memory ("DRAM") have decreased in size and increased in capacity dramatically over the last 20 years. As the capacity of memory cells has increased and the size has decreased, the design of the cells has become increasingly complex in order to preserve sufficient electrical capacitance to hold the electrical charge representing the stored data.

In the past silicon dioxide has been used as the dielectric in the capacitors of DRAM cells. However, silicon dioxide has a relatively low dielectric constant of about four. There has recently been experimentation with the use of other dielectric materials in order to increase the electrical capacitance in very small and complex cells. Some of this work has focused on the use of ferroelectric materials such as lead zirconate titanate ("PZT") as the dielectric in the capacitor for the production of a ferroelectric random access memory ("FRAM").

Ferroelectrics are dielectric in nature and exhibit spontaneous polarization which can be reversed by application of a suitable electric field. The polarization in these materials responds to an external electric field in a hysteresis fashion and thereby the materials exhibit bi-stable properties (two distinct states of polarization) which remain even after removal of the electric field. It is this hysteresis feature that makes ferroelectrics suitable for nonvolatile memory storage. The dielectric nature of ferroelectrics and their ability to display bistable properties can be used to make a ferroelectric capacitor which stores binary digital information based on the polarization state of the material. This opens up the possibilities of integrating a ferroelectric capacitor into the existing silicon and gallium arsenide VLSI technology to make a commercial nonvolatile random access memory. An example of a PZT device is described in U.S. Pat. No. 5,109,357 by Eaton.

Several problems need to be overcome before a commercially viable memory product is available. One of the foremost among these problems is the degradation properties of PZT ferroelectric devices. Degradation properties include fatigue, low voltage breakdown, and aging. A common source for these degradation properties is the interaction between defects in the materials and the ferroelectric-electrode interface/grain boundaries in the ferroelectric capacitor.

Considering the problem of fatigue, ferroelectrics are noted to lose some of their polarization as the polarization is reversed. This is known as fatigue degradation, and is one of the prime obstacles to forming high quality ferroelectric films. Fatigue occurs because of defect entrapment at the ferroelectric-electrode interface. Asymmetric electrode-ferroelectric interfaces and/or non-uniform domain distribution in the bulk can lead to asymmetric polarization on alternating polarity. This results in an internal field difference which can cause effective one-directional movement of defects like vacancies and mobile impurity ions. Since the electrode-ferroelectric interface is chemically unstable, it provides sites of lower potential energy to these defects relative to the bulk ferroelectric thereby causing defect entrapment at these interfaces (see Yoo, et al., "Fatigue Modeling of Lead Zirconate Titanate Thin Films", Jour. Material Sci. and Engineering). This entrapment will result in a loss in polarization in the ferroelectric.

To overcome this problem caused by defects, it is necessary to control the defect concentration, defect migration to the interface, defect entrapment at the interface, and the state of the interface itself. Lattice mismatch, poor adhesion, and large work function differences between the electrode and the ferroelectric causes the interface to be chemically unstable. Therefore, it is necessary to choose an appropriate electrode which can reduce the lattice mismatch, work function differences, and the adhesion problem at the interface. The existing, commonly-used, metal electrodes such as Pt, Au, etc., do not satisfy these criteria because of the large differences in crystal structures between the electrode (metal) and the ferroelectric (ceramic), and because of the work function differences. To control the defect migration and entrapment it is necessary to reduce the abrupt compositional gradient between the electrode and the ferroelectric.

Another obstacle to integrating PZT films into the existing semiconductor process is the high temperature post-deposition annealing needed to form the desirable perovskite phase. This annealing is required because most of the as-deposited films are amorphous, and they form an intermediate nonferroelectric pyrochlore phase before the formation of the perovskite phase. The transformation temperatures for initial perovskite formation and complete perovskite formation of the PZT films are functions of the compositions and the type of substrate used for deposition. Typical annealing temperatures for 53/47 films vary from 650° C. to 750° C. At these annealing temperatures, interdiffusion among the PZT films, the contact electrodes, and the underlying metallization becomes a concern; furthermore, thermal stress developed during the high temperature annealing may affect the long-term reliability of the device.

A variety of techniques have been used for the deposition of ferroelectric thin films. In general, the thin film deposition techniques can be divided into two major categories: (1) physical vapor deposition (PVD) and (2) chemical processes. Among the PVD techniques, the most common methods used for the deposition of ferroelectric thin films are electron beam evaporation, rf diode sputtering, rf magnetron sputtering, dc magnetron sputtering, ion beam sputtering, molecular beam epitaxy (MBE), and laser albation. The chemical processes can be further divided into two subgroups, i.e., metalorganic chemical vapor deposition (MOCVD), and wet chemical processes including sol-gel process and metalorganic composition (MOD). The third, newer process also used in the deposition of ferroelectric thin films is the liquid source delivery method.

The PVD techniques require a high vacuum, usually better than $10^{-5}$ torr, in order to obtain a sufficient flux of atoms or ions capable of depositing onto a substrate. The advantages of the PVD techniques are (1) dry processing, (2) high purity and cleanliness, and (3) compatibility with semiconductor integrated circuit processing. However, these are offset by disadvantages such as (1) low throughput, (2) low deposition rate, (3) difficult stoichiometry control, (4) high temperature post-deposition annealing, and (5) high equipment costs.

The advantages of the wet chemical process are (1) molecular homogeneity, (2) high deposition rate and high throughput, (3) excellent composition control, (4) easy introduction of dopants, and (5) low capital cost, since deposition can be done in ambient condition and so no vacuum processing is needed. The major problems due to this wet process are (1) film cracking during the post-annealing process and (2) possible contamination which results in difficulty in incorporating this technique into semiconductor processing. However, because it provides a fast and easy way to produce complex oxide thin films, this wet chemical process has a very important role in the investigation of the interrelationship among the processing, the microstructure, and the property of the films.

Of all the above mentioned techniques, the metalorganic chemical vapor deposition (MOCVD) technique appears to be one of the most promising because it offers advantages of simplified apparatus, excellent film uniformity, composition control, high film densities, high deposition rates, excellent step coverage, and amenability to large scale processing. The excellent film step coverage that can be obtained by MOCVD cannot be equaled by any other technique. Purity, controllability, and precision that have been demonstrated by MOCVD are competitive with the MBE technique. More importantly, novel structures can be grown easily and precisely. MOCVD is capable of producing materials for an entire class of devices which utilize either ultra-thin layers or atomically sharp interfaces. In addition, different compositions can be fabricated using the same sources.

The first successful deposition of oxide-based ferroelectric thin films by CVD was reported by Nakagawa, et al. in "Preparation of $PbTiO_3$ ferroelectric thin film by chemical vapor deposition", *Jpn. J. Appl. Phys.*, 21(1), L655 (1982). They deposited $PbTiO_3$ films on Pt-coated silicon wafers by using $TiCl_4$, $PbCl_2$, $O_2$ and $H_2O$ as source materials. Several problems arose from their studies: (1) very high evaporation temperature (700° C.) was required of $PbCl_2$, (2) poor ferroelectric properties ($P_r$=0.16 $\mu C/cm^2$ and $E_c$=14.5 kV/cm), (3) poor composition uniformity in the bulk of $PbTiO_3$ films, and (4) crystallographic imperfections due to water and/or chloride contamination. Obviously, chlorides are not ideal precursors for the CVD process. In general, metalorganic precursors have relatively high vapor pressures at lower temperatures. By carefully selecting the organic compounds, the undesirable contaminations in the films can be completely excluded. Metalorganic compounds are now used almost exclusively for the deposition of oxide thin films.

SUMMARY OF THE INVENTION

The present invention is a memory device having a thin film perovskite layer of a rate earth manganate such as Y, Ho, Er, Tm, Yb or Ln. The device in a preferred embodiment includes a substrate of silicon, gallium arsenide or other known substrate materials, a bottom electrode, a perovskite thin film of a rare earth manganate of the formula $A^{3+}MnO_3$, where A=Y, Ho, Er, Tm, Yb or Lu, and a top electrode.

The rare earth manganates used with the present invention have very desirable properties for use in ferroelectric memory devices, including a high Currie temperature at which the transition occurs from the ferro-electric to the paraelectric state, a high saturation polarization, a small dielectric constant, and relatively low piezoelectric coefficients.

The rare earth manganate ferroelectric layer can be applied with either a MOCVD process or a MOD process.

The MOCVD process utilizes precursors of $Y(thd)_3$ where thd=$C_{11}H_{19}O_2$, and $(CH_3C_5H_4)Mn(CO)_3$ with $N_2$ as a carrier gas and $O_2$ as a dilute gas. The MOCVD process produces a thin film with excellent film uniformly, composition control, high density, high deposition rates and excellent step coverage, utilizing fairly simple equipment that is amenable to large scale processing.

The MOD process for applying the rare earth manganate ferroelectric layer produces a film with high molecular homogeneity, and allows for a high deposition, high throughput, excellent composition control and easy introduction of dopants. Solvents of methanol, methoxythanol, 1-propanol or ethyele glycol are used.

DETAILED DESCRIPTION OF THE INVENTION

Figure 1:
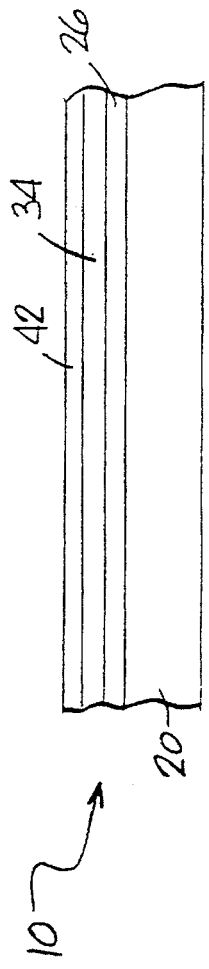
FIG. 1 is a schematic depiction of a memory device in accordance with the present invention.

A schematic depiction of a memory device 10 in accordance with the present invention is shown in FIG. 1. The device 10 includes a substrate 20 of a suitable material such as silicon, sapphire or gallium arsenide. The substrate 20 may be a multilayer structure having several circuit elements or a silicon chip having layers of silicon oxide, polysilicon or implanted silicon layers to form a complex integrated circuit. A conductive layer, acting as a bottom electrode 26, is applied to the substrate. A ferroelectric perovskite thin film 34 is applied over the conductive layer 26. The perovskite thin film has the composition described below. Another conductive layer, acting as a top electrode 42, is applied to the perovskite thin film. The top and bottom electrodes 42 and 26 may be for example, conducting oxide or a conducting metal.

The ferroelectric perovskite thin film 34 is a rare earth manganate with the general formula of: $A^{3+}MnO_3$, where A=Y, Ho, Er, Tm, Yb or Lu. Such rare earth manganates are uniaxial ferroelectrics in hexagonal layered $P6_3cm$ phase. Investigation of the electrical properties of rare earth manganates has shown that the Curie temperature at which the transition from the ferroelectric to the paraelectric state occurs is above 500° C. In addition to having a relatively high Curie temperature, rare earth manganates exhibit other favorable characteristics, including a high saturation polarization ($P_s$=6 μC/cm²j) and a small dielectric constant (ε=20 at 20° C.). Further, it is expected that these compounds will have relatively small piezoelectric coefficients. Because manganese prefers higher oxidation states in oxidizing atmospheres, the oxygen vacancy concentration is expected to be small. These properties of rare earth manganates are consistent with fatigue-free, high retentivity, ferroelectric memories. Some of the properties of rare earth manganates (specifically, $YMnO_3$) are tabulated as follows:

| Crystal Structure | Hexagonal (a = 0.613 nm and c = 1.1505 nm) |
| --- | --- |
| Curie Temperature | 640° C. |
| Spontaneous Polarization | 6 μC/cm² |
| Coercive Field | 25 kV/cm |
| Resistivity | $10^{10}$ Ωm at R.T. |
| Dielectric Constant | 20 at R.T. |

The perovskite thin film 34 of a rare earth manganate can be applied to the bottom electrode by metalorganic chemical vapor deposition ("MOCVD") or by metalorganic decomposition ("MOD"). The MOCVD process offers the advantages of a simplified apparatus, excellent film uniformity, composition control, high film densities, high deposition rates, excellent step coverage, and amenability to large scale processing. It is believed that the excellent film step coverage that can be obtained by MOCVD cannot be equalled by any other known technique. Also, novel structure can be grown easily and precisely with MOCVD, and MOCVD is capable of producing materials for an entire class of memory devices that utilize either ultra-thin layers or atomically sharp interfaces.

Figure 2:
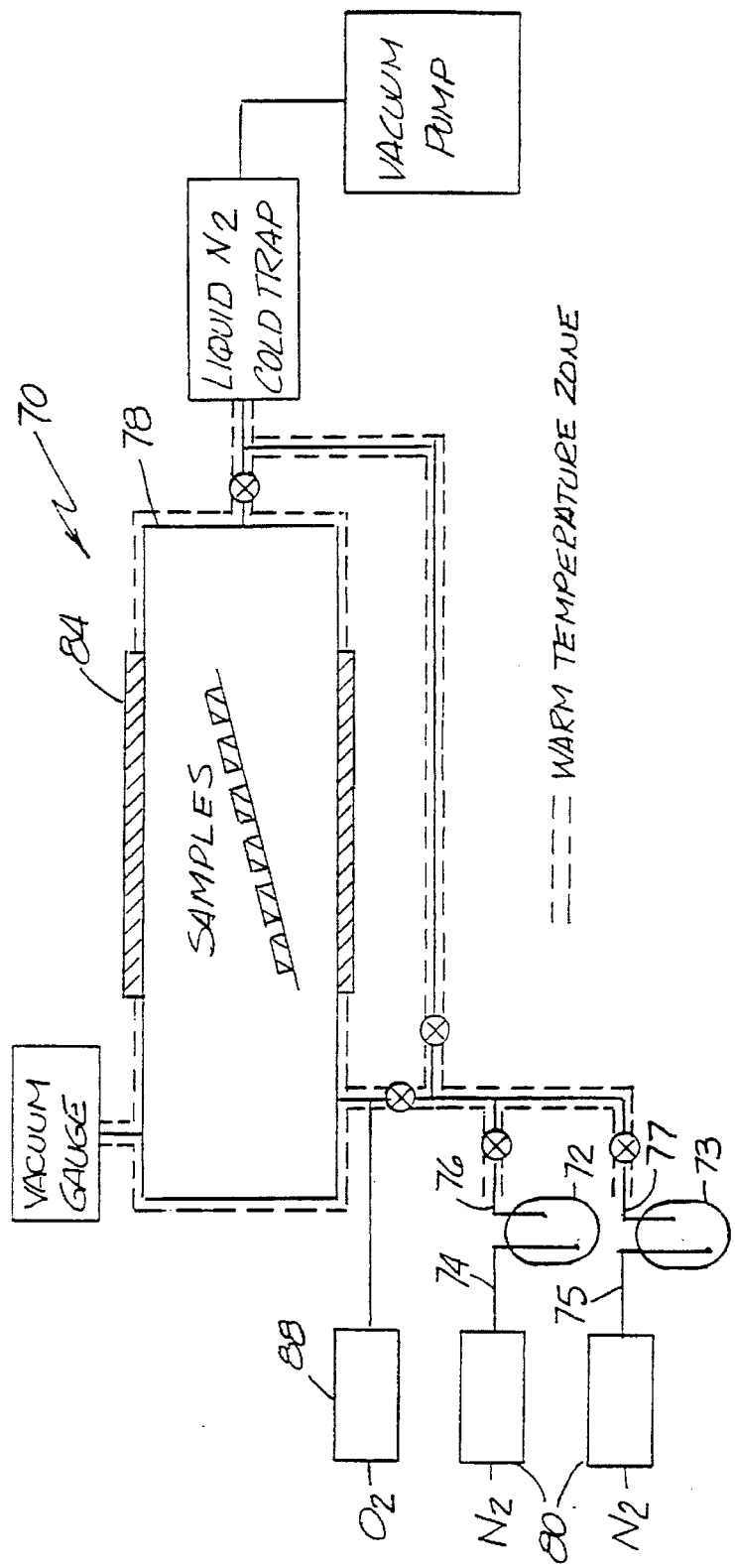
FIG. 2 is a schematic diagram of an apparatus for use in applying ferroelectric perovskite thin films of rare earth manganates in accordance with the MOCVD process of the present invention.

A schematic diagram of an apparatus 70 for use in applying ferroelectric perovskite thin films of rare earth manganates is shown in FIG. 2. The precursor materials are packaged in stainless steel bubblers 72 and 73, each having two connects 74 and 76, and 75 and 77, respectively. One connect 74 runs to be the reaction chamber 78 while the other connector 76 runs to a set of $N_2$ gas cylinders 80 with mass flow controllers. The reaction chamber 78 is a stainless steel tube. Heating of the substrate is achieved with a reaction chamber heater 84 or, alternatively, with a substrate heater. Oxygen is added by an oxygen source 88.

A MOCVD apparatus such as the one described above was used to deposit a ferroelectric perovskite thin film of $YMnO_3$ under the following conditions:

| Precursors | Y(thd)$_3$ |
| --- | --- |
| | $(CH_3C_5H_4)$ Mn(CO)$_3$ |
| Bubbler Temp. | 130–150° C. 160–180° C. |
| Carrier Gas | $N_2$, 20–40 sccm |
| | $N_2$, 5–10 sccm |
| Dilute Gas | $O_2$, 500–1000 sccm |
| Deposition Temp. | 500° C. |
| Chamber Pressure (where thd = $C_{11}H_{19}O_2$) | 2–10 torr |

These conditions produce a deposition rate of 10–20 nm/min.

In a MOD process for applying ferroelectric perovskite thin films of rare earth manganates, there are disadvantages related to film cracking during the post-annealing process and also possible contamination. However, an MOD process has the advantages of producing a film with high molecular homogeneity. It also allows for a high deposition rate and high throughput, excellent composition control, and easy introduction of dopants. In addition, the equipment costs are relatively low since the deposition can be done in ambient condition without vacuum processing. Table 1 below shows the results of a MOD process for the production of a ferroelectric perovskite thin film of $YMnO_3$ under several conditions, using Yttrium Acetate and Manganese(III) Acetate as starting materials.

Figure 3:
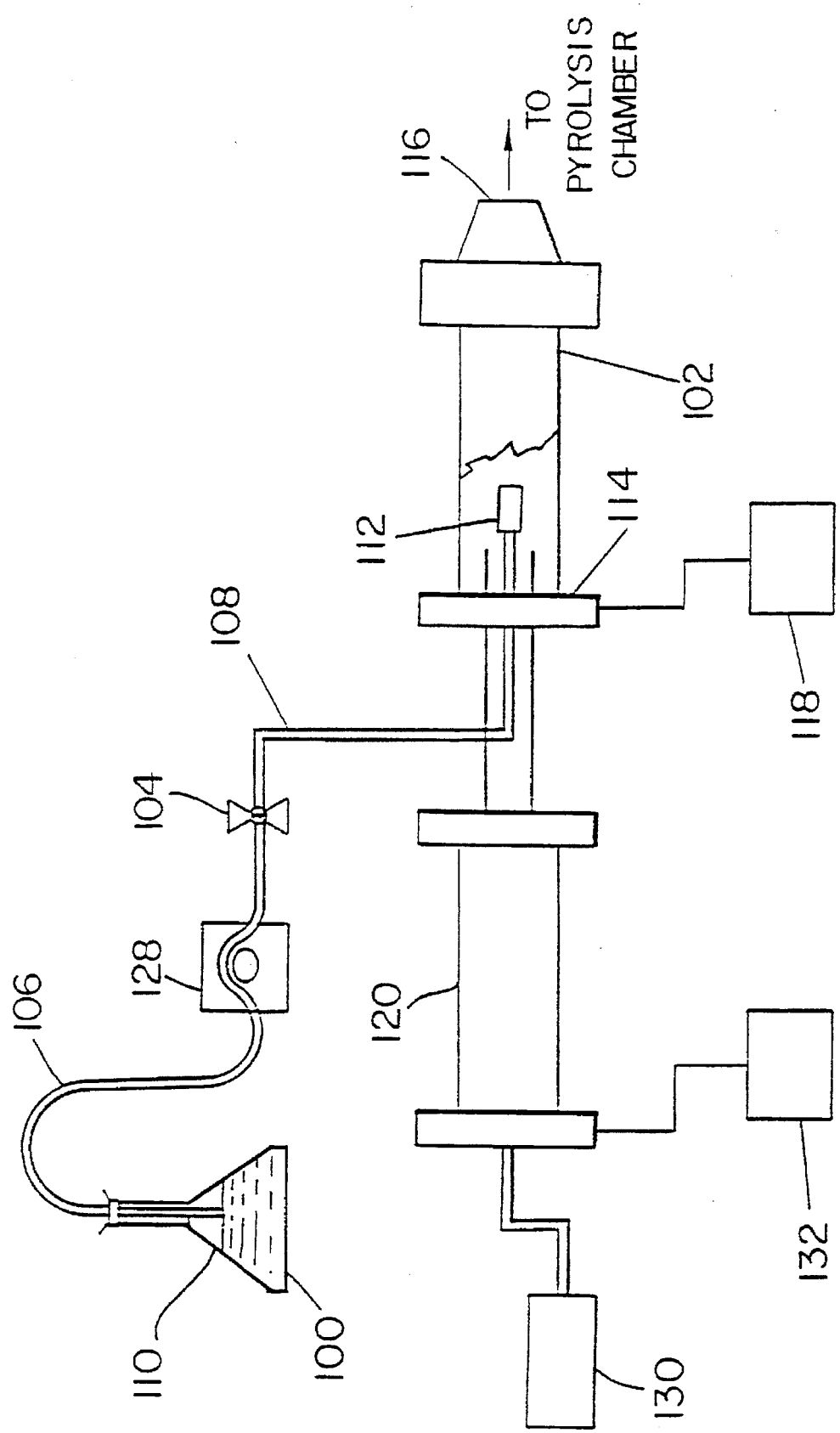
FIG. 3 is a schematic diagram of an apparatus for use in applying ferroelectric perovskite thin films of rare earth manganates in accordance with the liquid source delivery process of the present invention.

Alternatively, a liquid source delivery process may be used for applying ferroelectric perovskite thin films of rare earth manganates. A schematic of the liquid source delivery system used as a part of the present invention is shown in FIG. 3. The source materials of the desired thin film compound are mixed stoichiometrically and held in the liquid form in an Erlenmeyer flask 110. The source is transferred to the flash vaporization chamber 102 by a Masterflex Economy drive 128 (basically a pump with a liquid flow meter) through a series of tubes as shown in FIG. 3. A needle valve 104 is inserted in the flow line to control the flow of the liquid and is connected to the source end by silicone tubing 106 and the vaporization chamber end by stainless steel tubing 108. The source is transferred from the flask 110 to the silicone tubing 106 through a glass rod. The vaporization chamber 102 is sealed on the source end by a flange 114. The stainless steel tube 108 that provides the path for the liquid source delivery is inserted into the vaporization chamber 102 through a tight fit hole drilled into the flange 114. The other end of the chamber 102 is connected to the pyrolysis chamber of the MOCVD reactor, the temperature of which is controlled by a preheat chamber temperature controller 132. The vaporization chamber 102 is heated as a whole and the temperature is controlled using a temperature controller 118. A preheated carrier gas ($N_2$) is used to transport the vaporized source from the vaporization chamber 102 to the pyrolysis chamber. The flow rate of the carrier gas is controlled using a mass flow controller 130. The carrier gas is sent through a preheat chamber 120 to heat the gases.

Figure 4:
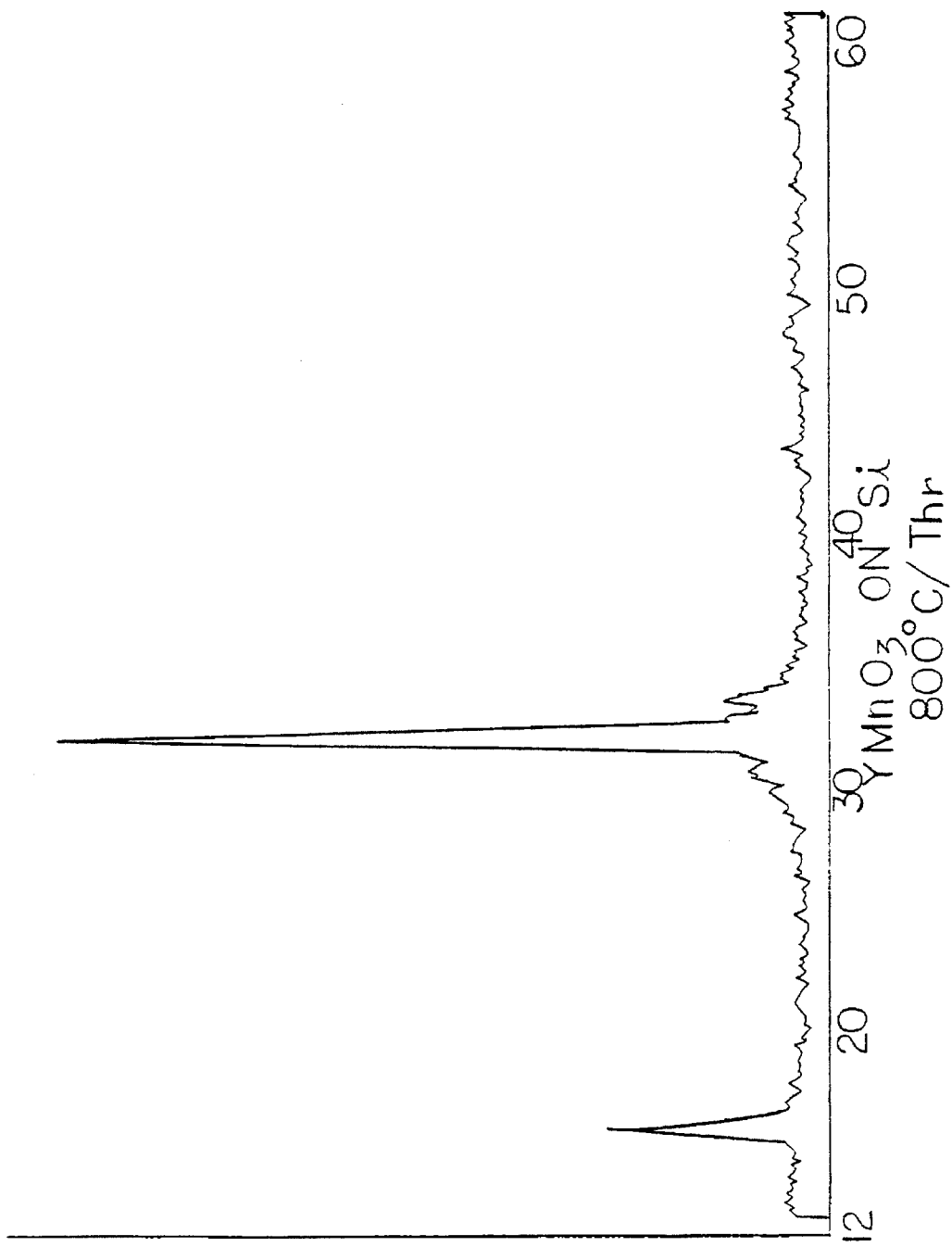
FIG. 4 is a graph of an XRD pattern for a ferroelectric perovskite thin film of a rare earth manganate applied to Si in accordance with the MOD process of the present invention.
Figure 5:
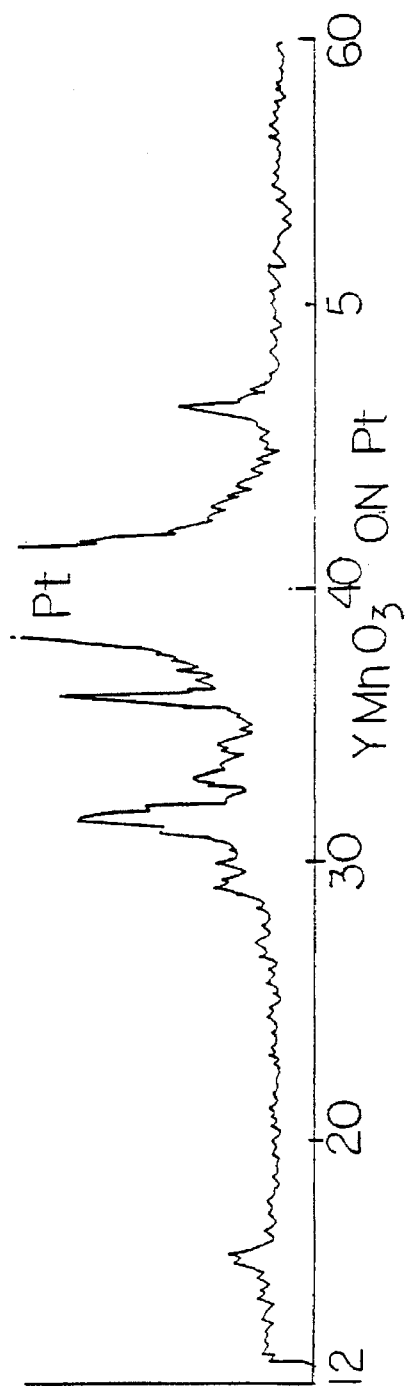
FIG. 5 is a graph of an XRD pattern for a ferroelectric perovskite thin film of a rare earth manganate applied to PT in accordance with the MOD process of the present invention.
Figure 6:
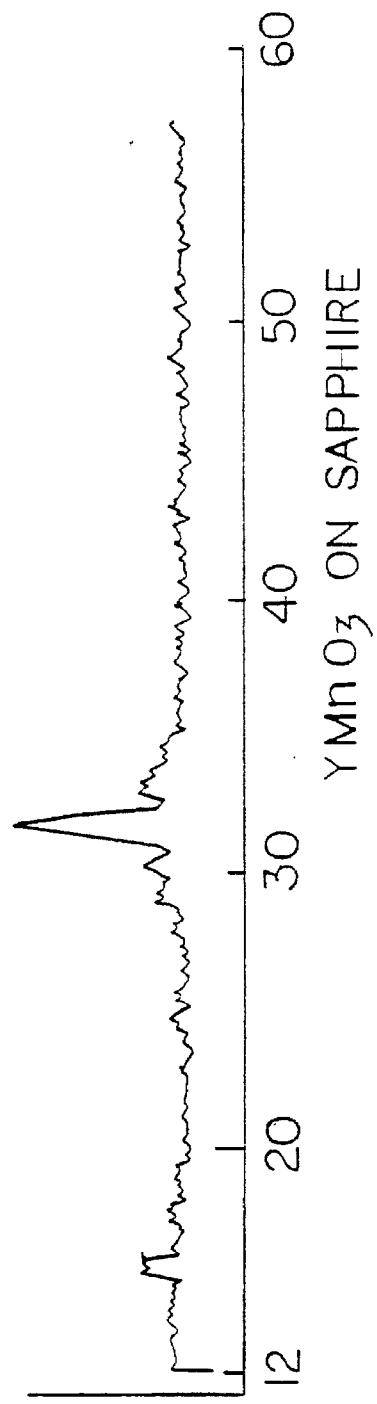
FIG. 6 is a graph of an XRD pattern for a ferroelectric perovskite thin film of a rare earth manganate applied to sapphire in accordance with the MOD process of the present invention.

The XRD patterns for the resulting films are in FIGS. 4–6. FIG. 4 shows the XRD pattern of a thin film of $YMnO_3$ on Si; FIG. 5 shows the XRD pattern of a thin film of $YMnO_3$ on Pt; and FIG. 6 shows the XRD pattern of a thin film of $YMnO_3$ on sapphire.

TABLE 1

| SOLVENT | MOLE | SPIN SPEED | DRYING TEMP. | FILM APPEARANCE | PHASE |
| --- | --- | --- | --- | --- | --- |
| Methanol | 0.3 | 2000 | 90° C. | good | pure $YMnO_3$ |
| Methoxyethanol | 0.3 | 2000 | 140° C. | excellent | not single phase |
| 1-Propanol | 0.3 | 2000 | 120° C. | excellent | not single phase |
| Ethylene Glycol | 0.3 | 4000 | 210° C. | excellent | pure $YMnO_3$ |
| Methanol + Ethylene Glycol | 0.3 | 4000 | 210° C. | excellent | pure $YMnO_3$ |

What is claimed is:

1. A memory device, comprising:

a substrate;

a film of a rare earth manganate; and at least one electrode on the film; wherein said film is produced by a process of metalorganic chemical vapor deposition including as a precursor at least one of $(CH_3C_5H_4)Mn(CO)_3$;

$A(C_{11}H_{19}O_2)_3$, A being selected from the group consisting of Y, Ho, Er, Tm, Yb, and Lu;

an alkyl of an element selected from the group consisting of Mn, Y, Ho, Er, Tm, Yb, and Lu;

an alkoxide of an element selected from the group consisting of Mn, Y, Ho, Er, Tm, Yb, and Lu;

a beta-diketonate of an element selected from the group consisting of Mn, Y, Ho, Er, Tm, Yb, and Lu;

a metallocene of an element selected from the group consisting of Mn, Y, Ho, Er, Tm, Tb, and Lu; or a combination of at least two of an alkyl, alkoxide, beta-diketonate and a metallocene of elements selected from the group consisting of Mn, Y, Ho, Er, Tm, Tb, and Lu.

2. The memory device of claim 1, comprising:

a substrate;

a film of a rare earth manganate; and at least one electrode on the film of the formula $A^{3+}MnO_3$, where A is selected from the class consisting of Y, Ho, Er, Tm, Yb, and Lu; wherein said film is produced by a process of metalorganic decomposition including use of at least one of yttrium acetate and manganese and manganese(III) acetate as a starting material.

* * * * *

UNITED STATES PATENT AND TRADEMARK OFFICE
CERTIFICATE OF CORRECTION

PATENT NO. : 5,625,587
DATED : April 29, 1997
INVENTOR(S) : Peng, et. al.

It is certified that error appears in the above-indentified patent and that said Letters Patent is hereby corrected as shown below:

Title page, item [73],Assignee: add Sharp Kabuskiki Kaisha, Osaka, Japan--.

Signed and Sealed this

First Day of July, 1997

Attest:

BRUCE LEHMAN

Attesting Officer

Commissioner of Patents and Trademarks